United States Patent [19]

Ruotsalainen

[11] Patent Number: 5,315,183

[45] Date of Patent: May 24, 1994

[54] SYNCHRONOUS PHASE DETECTOR CIRCUIT

[75] Inventor: Asko Ruotsalainen, Oulu, Finland

[73] Assignee: Nokia Mobile Phones Ltd., Salo, Finland

[21] Appl. No.: 993,602

[22] Filed: Dec. 21, 1992

[51] Int. Cl.$^5$ ............................................. H03L 7/00
[52] U.S. Cl. .................................. 307/511; 307/262; 328/155
[58] Field of Search ............... 307/511, 514, 516, 262; 328/133, 134, 155

[56] References Cited

U.S. PATENT DOCUMENTS

| | | | |
|---|---|---|---|
| 4,267,514 | 5/1981 | Kimsey | 328/133 |
| 4,633,487 | 12/1986 | Goeb et al. | 328/134 |
| 4,843,332 | 6/1989 | Cok et al. | 307/511 |

Primary Examiner—Timothy P. Callahan
Assistant Examiner—My-Trang Nu Ton
Attorney, Agent, or Firm—Perman & Green

[57] ABSTRACT

A phase detector for high speed logic circuits including an edge detector circuit responsive to two signals which may contain frequency and phase errors which result in the edges of the signal pulses of the two signals occurring at different times. The edges of the two signal pulses are detected by a phase detector circuit and an output signal provided to a correction circuit that provides a correction signal for the time period between the pulse edges of the signal pulses. The correction circuit output signal is fed back to a local oscillator to minimize the frequency and phase errors. A synchronizing circuit is connected to the output of the correction circuit to synchronously reset the phase detector circuit at the end of the correction signal period.

7 Claims, 3 Drawing Sheets

SYNCHRONOUS PHASE DETECTOR CIRCUIT

BACKGROUND OF THE INVENTION

1. Field of the Invention

The present invention relates to high speed ASIC technology, and more particularly to a synchronous phase detector means for ASIC circuits.

2. Background Art

A typical phase detector circuit known in the art is illustrated in FIG. 1 and includes two flip-flops, which are clocked by two signals (Reference and VCO) having small frequency and phase errors. The logic circuit examines the rising edges of two signals, and the difference between them controls the VCO frequency through a loop filter in order to minimize the frequency and phase errors.

The first rising edge starts the active correction period, and it continues until the latter clock rises. The output of phase detector is active during this correction period (high or low depending on the error direction), and after the latter rising edge the logic is reset asynchronously.

In known high speed ASIC circuits this asynchronous resetting may cause problems, because the clear pulse disappears when the first flip-flop is cleared, and it cannot be certain if a short reset glitch works for both flip flops. Also, using separate frequencies may cause unwanted metastable states, which may cause uncorrect behavior.

SUMMARY OF THE INVENTION

An object of the present invention is to provide an improved phase detector circuit for high speed ASIC's.

Another object of the present invention is to provide an improved phase detector circuit employing a synchronous design for ASIC circuits.

Still another object of the present invention is to provide a synchronous phase detector which minimizes metastability in ASIC systems.

DESCRIPTION OF A PREFERRED EMBODIMENT

Figure 1:
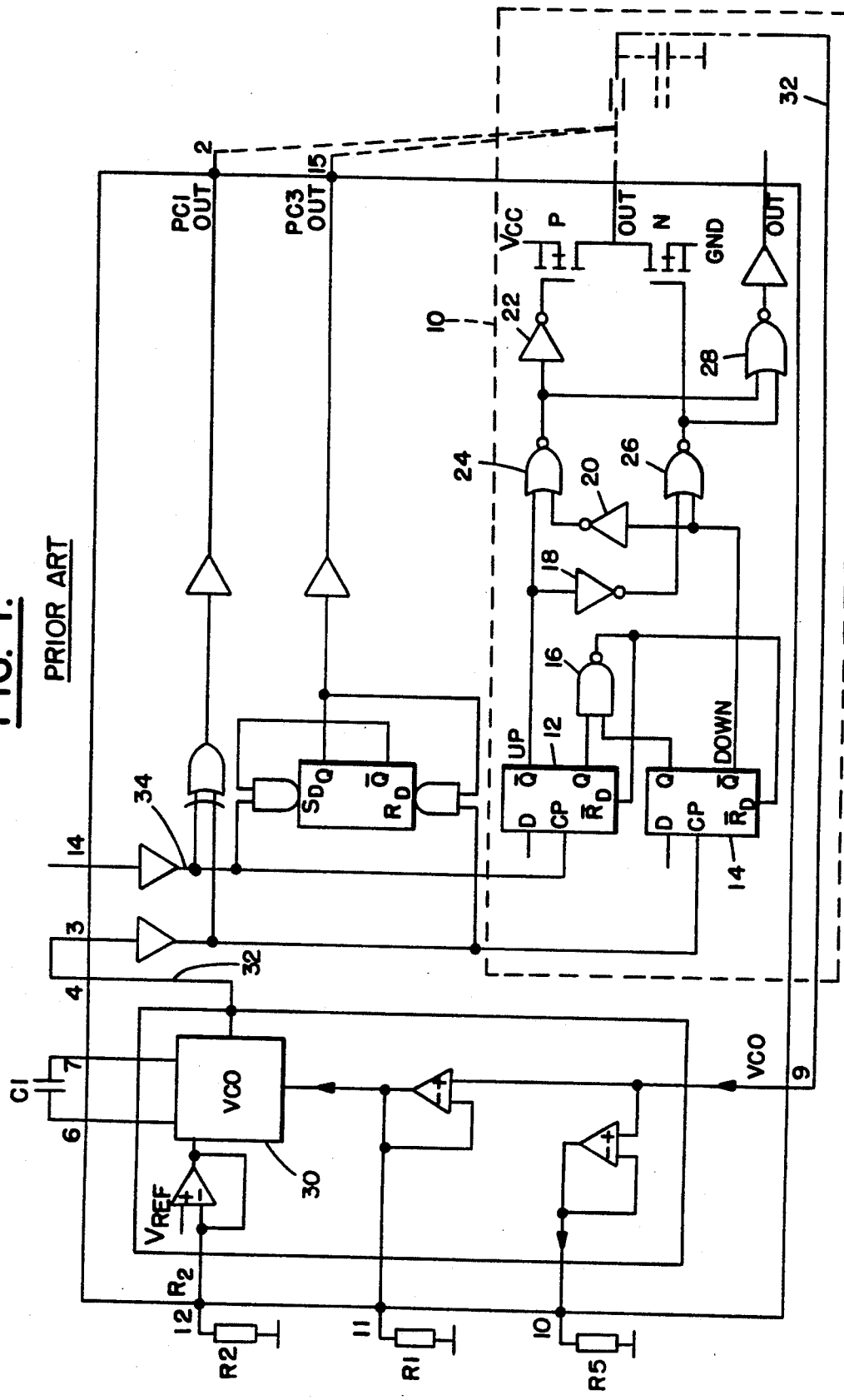
FIG. 1 is a schematic illustration of an asynchronous phase detector circuit known in the art.

As previously stated, FIG. 1 is a schematic illustration of an ASIC logic diagram, incorporating an asynchronous phase detector circuit 10 of a type known in the art which includes flip-flop circuits 12 and 14; a NAND device 16; three NOT (invertor) devices 18, 20 and 22; and three NOR devices 24, 26 and 28. A voltage controlled oscillator 30 is included in the ASIC logic and provides an output signal on lead 32 designated VCO. A reference signal Vref on lead 34 and the VCO signal on lead 32 are applied respectively as input signals to flip-flops 12 and 14 in the asynchronous phase detector circuit 1.0.

The logic devices examine the rising edges of the $V_{ref}$ and VCO signals and the differences between them is used to control the frequency of the voltage controlled oscillator 30 via a loop filter which functions to minimize the frequency and phase errors until a common frequency is obtained. When the common frequency is achieved, the rising edges of the $V_{ref}$ and VCO signals, and therefore the VCO and $V_{ref}$ signals occur at the same time.

More particularly, in the correction operation of the phase detector 10, the first rising edge to occur, which may be either the Vref signal to flip-flop 12 or the VCO signal to flip-flop 14, starts the active correction operation time and it continues until the other rising edge signal of the other flip-flop input signal causes the other flip-flop output signal to go up.

During the active correction period, the logic device connected to the output signals from the flip-flops determines the difference between the rising edges of the two signals' and a difference signal, which may be either high or low depending on the error direction, is provided on lead 32 and is fed back to the voltage controlled oscillator 30. After the occurrence of this second rising edge signal, the logic devices in phase detector circuit 10 are reset asynchronously.

As previously mentioned, in presently available high speed ASIC circuits, asynchronous resetting is a problem because the "clear" pulse disappears when the first one of the flip-flops is cleared, and it can not be certain if such short reset pulse operates both flip-flops. Another problem with presently available phase detector circuits is that the use of separate frequencies may produce undesired metastable states and result in incorrect operation.

Figure 2:
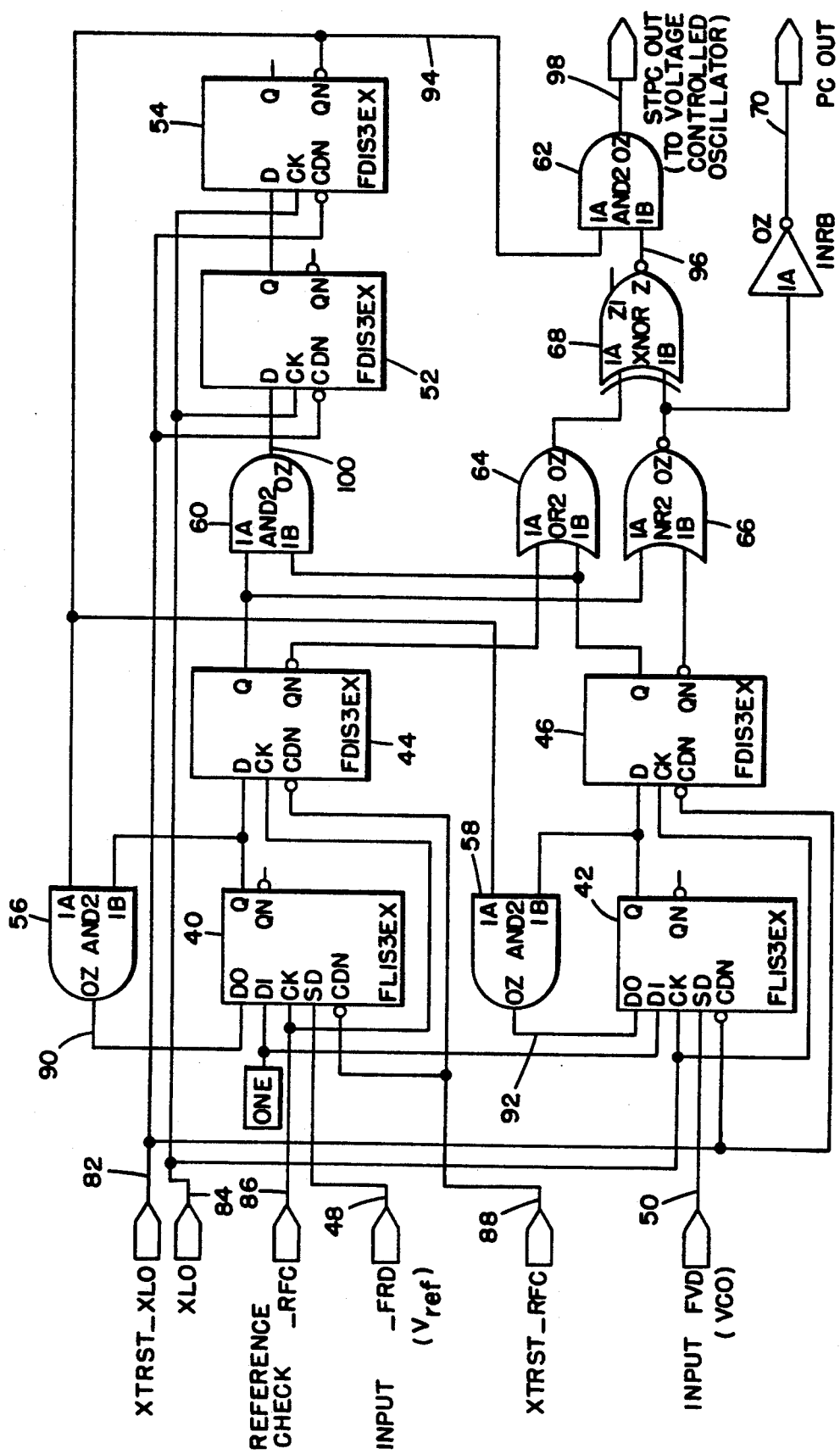
FIG. 2 is schematic illustration of an improved phase detector circuit for ASIC following the principles of the present invention.

Referring to FIG. 2, a schematic illustration is shown for a synchronous phase detector circuit which is designed to be employed in the place of asynchronous phase detector circuit 10 in the ASIC logic of FIG. 1. The circuit of FIG. 2 is not a direct replacement for circuit 10 of FIG. 1. As previously stated, the circuit of FIG. 2 will employ external frequency dividers to frequency divided the VCO signal to provide an FVD signal and to frequency divide the $V_{ref}$ signal to provide an FRD signal and not provided in FIG. 1 and will also employ an external VCO circuit of the type shown in FIG. 1.

In the drawing of FIG. 2 the various signals are given designations which appear at appropriate points in the schematic. These designations are as follows:

VCO: Voltage controlled oscillator signal.
XTRST XLO: Active low master reset signal synchronized to the XLO input clock signal.
XTRST RFC: Active low master reset signal synchronized to the RFC input clock signal.
XLO: Clock frequency signal from VCO
RFC: Another input clock frequency signal, used as a reference signal in phase detector.
FRD: Input frequency signal to the phase detector that is divided from the reference frequency.
FVD: input frequency signal to the phase detector that is divided from the VCO frequency.
ONE: VDD
STPCOUT: PCOUT output signal that is a three state signal, and STPCOUT (active high) enables that output. Three-state control.
PCOUT: The output signal from Phase Comparator Circuit.
DO_RFC: The output signal from AND device
DO_XLO: The output signal from AND device 58.

STPCOUT_ORIG: Internal signal use to generate STPCOUT.

In FIG. 2 phase detector correction operation the reference signal VRef frequency and the VCO signal frequency are divided to produce the FRD signal and the FVD signal respectively until a common frequency is found for both the FRD and FVD signals. The VCO VRef frequencies are divided by simple frequency divider circuits whose inputs are the VCO and VRef clocks and wherein the VRef frequency is divided by a first suitable value and the VCO frequency is divided by a second suitable value such that the resulting outputs designated FRD & FVD both have common frequencies. The FRD & FVD are one input clock cycles long strobe signals which are used as enable circuits in the phase detector circuit in FIG. 2.

In FIG. 2 edge detection means including first and second edge detection flip-flops 40, 42 and correction means including correction flip-flops and 44, 46 are provided. The input signals to the flip-flops 40 and 42 includes a divided reference signal FRD, a divided VCO signal FVD and an original higher frequency clock signals XLO to flip-flop 42 on lead 84 and RFC to flip-flop 40 on lead 86.

The reference signal FRD appears on lead 48 to flip-flop 40 and the VCO signal FVD appears on lead 50 to flip-flop 42. Synchronizing means including synchronizing flip-flops 52 and 54 are provided to recover metastable states and implement synchronous resetting. Four AND device 56, 58, 60 and 62; an OR device circuit, a NOR device 66 and an XNOR device are also included in this phase detector for gating the signals and are interconnected as shown in FIG. 2.

The reference signal FRD on lead 48 and the VCO signal on lead 50 are applied to the respective flip-flops 40 and 42. These signals are of relatively lower frequency, having been frequency divided, are used to enable the edge detector flip flops 40 and 42. A higher frequency clock signals RFC and XLO is also applied to the flip-flops 40 and 42 respectively to provide a clocking function. By using divided lower frequencies as enabled signals and original higher frequencies as clock inputs the amount of different clocks used in the circuit is reduced and minimized.

The first rising edge to occur (of either the FRD (reference) signal on lead 48 or the FVD (VCO) signal on lead 50) starts the active correction period by enabling the respective one of edge detection flip-flop 40 or 42. The active correction period continues until the occurrence of the rising edge of the other (FRD or FVD) signal enables the other flip-flop. As previously mentioned, a distinction of the present invention is that the phase detector operates in a synchronous manner. The two flip-flops 40 and 42 are synchronized in that if a first one of the two flip-flops 40 and 42 goes into a metastable state, then the second flip-flop either does not go metastable or metastability is recovered during one clock cycle. The output of the phase detector circuit appears on lead 70 which is connected back to the voltage controlled oscillator as illustrated in FIG. 2.

Figure 3:
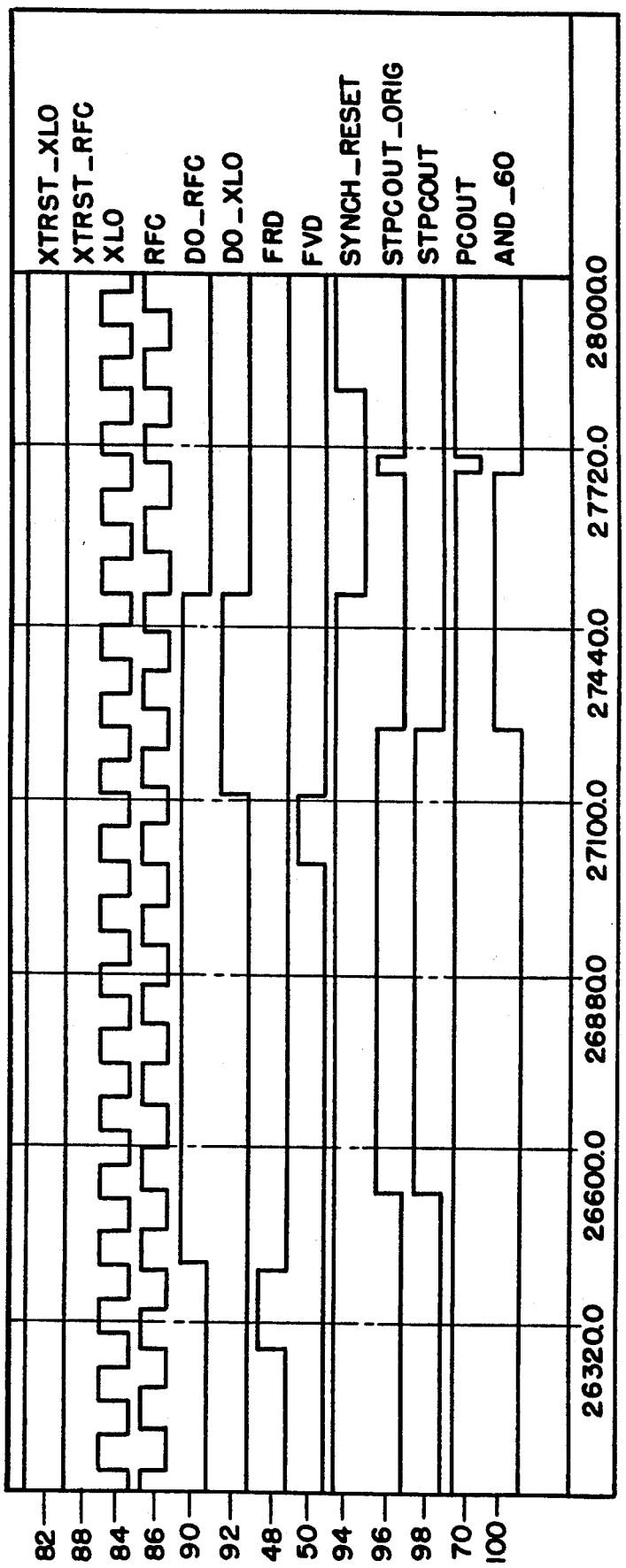
FIG. 3 is an illustration of a plurality of signal waveforms associated with the synchronous phase detector circuit of FIG. 2.

Referring to FIG. 3, a waveform diagram is shown which illustrates the signals used in the circuit of FIG. 2. The reference numbers 82, 84, 86, 88 etc for the waveforms of FIG. 3 are also used to designate the places in the circuit of FIG. 2 where the waveforms occur.

It should be noted that in FIG. 3 the two input signals FRD and FVD are shown consisting of pulses that have rising edges and falling edges. In FIG. 3, by way of example, the "rising" edge of FRD occurs before that of FVD. In another case, the rising edge of FVD may occur before that of FRD, but the circuit would function the same. The "falling" edge of FRO is shown in FIG. 3 coinciding in time with a rise in DO-RFC (the output of AND circuit 56) and the "falling" edge of FVD is shown coinciding in time with a rise in DO-XLO (the output of AND circuit 58). Thus, the rise and subsequent fall of FRD raises the DO-RFC pulse and the later rise and subsequent fall of FVD raises the DO_XLO pulse.

Thus, what occurs on the falling edges of FRD/FVD is that input signals FRD & FVD are used as a enables to first flip-flops 40 and 42, and when an input rises it is detected on the next rising edge of the clock RFC or XLO that also causes the FRD or FVD signals to fall. That causes one clock pulse long delay. So the DO_RFC & DO_XLO output signal changes resulting from the first flip-flops 40 and 42 are delayed as shown in FIG. 3.

When both the DO_RFC on lead 90 and the DO_XLO on lead 92 are active (high), it forces, after three XLO clock cycles, that the SYNCH-RESET signal on lead 94 to go low and the DO_RFC signal on lead 90 and the DO_XLO signal on lead 92 are forced low.

When both the DO_RFC and DO_XLO signals on leads 90 and 92 go high, due to the second flip-flops 44 and 46 one clock cycle later the PCOUT signal on lead 70 goes into the "three" state that is, the STPCOUT signal on lead 98 goes inactive and forces the PCOUT signal on lead 70 to the three state. Thus, transitions occur when both outputs of flip flops 44 & 46 go high.

More particularly, the sequence of operation of the circuit of FIG. 2 is as follows:

A one clock pulse long strobe is detected on FRD. The FRD signal is the Vref signal divided by a suitable value by a divider circuit not shown in the drawing. The divider circuit may be an external component. This FRD signal on lead 48 is the output of a flip-flop in the divider circuit that is clocked by the RFC signal. This FRD signal on lead 48 of FIG. 2 goes to enable the input of flip-flop 40, and after the next rising edge of the RFC signal on lead 86 (that also causes FRD to go low) the output of this first flip-flop 40 goes high and the DO_RFC signal rises. This signal propagates through the flip-flop 44, which goes high, and one clock pulse later the output of the flip-flop 46 also rises. After gate delays, the STPCOUT_ORIG signal on lead 96 goes active (it is high when either the output of flip-flop 44 or 46 is high, low if both or none is high, so it is a XNOR function from device 68. When the synch-reset signal on lead 94 is high, this rise is propagated also the AND device 62 to produce the STPCOUT signal in lead 98 (the start of the correction period), and PCOUT output signal goes active. The PCOUT signal on lead 70 also goes high because of activation due to the FRD signal, if the activation is due to the FVD signal, then it would go low). AND device 62 out stays low. This situation goes on until a strobe is detected in the FVD signal. This signal comes from the flip-flop clocked by the XLO clock signal. In a similar way as previously described, it goes to enable the input of flip-flop 42. On the next rising edge of the XLO clock signal, DO_XLO on lead 92 rises, and one clock pulse later the output of the next flip-flop 46 rises. This causes the STPCOUT ORIG signal or lead 96 and the STPCOUT signal on lead 98 to go inactive (the end of the correction period). The output of the phase detector goes three stated since the PCOUT signal is the output of the phase detection in FIG. 2, the PCOUT signal is the three stated output of ASIC.

When the outputs of both flip-flops 44 and 46 are high, the signal from AND device 60 out goes high, and after two clock pulses of the XLO clock it is propagated through the two synchronizing 52 and 54 flip-flops.

This causes the inverted output of flip-flop 54 (the Synch_reset signal) to go low which forces both the DO_RFC output from AND circuit 56 and the DO_XLO output from AND circuit 58 to go low (zero). This resets the flip-flops 40 and 42. This zero is propagated through two flip-flops, and the signal to AND circuit 62 goes low. Again two XLO clock cycles are needed and then zero is propagated through flip-flops 52 and 54. Now also output of flip-flop 54 also goes low (and the Synch_reset signal goes high).

The AND circuit 62 is gated with the Synch_reset signal on lead 94 to prevent a short pulse in the STPCOUT output signal at the end of the operation (when the Synch_reset signal is low) to go out. This is caused by the difference of input clocks during resetting.

Now the phase detector circuit goes to an idle state, and is ready and waiting for either a FRD signal or FVD signal.

What has been described is an improved and reliable phase detection means including a correction circuit and a synchronizing circuit in combination with an edge detection means for reducing frequency and phase errors on high speed logic circuits. While the invention has been particularly shown and described with respect to a preferred embodiment thereof, it will be understood by those skilled in the art that changes in form and details may be made therein without departing from the scope and spirit of the invention.

I claim:

1. A phase detection means for high speed logic circuits that functions in a synchronous mode in response to first and second frequency clock signals comprising:

a voltage controlled oscillator circuit for generating a first frequency clock signal VCO, a reference signal source for generating a second frequency clock signal $V_{ref}$, a source of clock signal XLO a source of clock signal RFC, an input signal FVD having a frequency that is a submultiple of the frequency of said first frequency clock signal VCO, an input signal FRD having a frequency that is a submultiple of said second frequency clock signal $V_{REF}$, and wherein said frequency of said FRD signal is the same as said frequency of said FVD signal;

a phase detector logic circuit including an edge detector circuit responsive to said FRD, FVD, XLO and RFC signals for producing a first output signal upon the occurrence of one of said FRD and RFC or FVD and XLO signal pairs and a second output signal upon the occurrence of the other of said FRD and RFC or FVD and XLO signal pairs, a correction circuit responsive to said first and second output signals from said edge detector circuit for producing an output pulse signal beginning in response to said first output signal from said edge detector circuit and ending in response to said second output signal from said edge detector circuit, the duration of said signal from said correction circuit being representative of the duration between the occurrence of said FRD and FVD signals output means connected to said correction circuit and to said voltage controlled oscillator circuit, said output means responsive to and applying said output pulse signal from said correction circuit to said voltage controlled oscillator circuit to adjust the frequency of said voltage controlled oscillator signal VCO until said FRD signal and said FVD signal occur in phase and a synchronizing means connected to the output of said correction circuit and to said XLO signal for generating a reset signal synchronous with the end of correction pulse from said correction circuit, said reset signal being connected to said edge detector circuit for resetting said edge detector circuit at the end of said correction pulse.

2. A phase detection means according to claim 1 wherein said edge detector circuit includes a first edge detector flip-flop circuit responsive to said RFC clock signal and said FRD signal and a second edge detector flip-flop circuit responsive to said XLO clock signal and said FVD signal, wherein said first edge detector flip flop circuit produces an output signal after the occurrence of said FRD and RFC signals and wherein said second edge detector flip-flop circuit produces an output signal after the occurrence of said FVD and XLO signals, wherein the time period between said output signals form said first and second flip-flop circuits being the phase detection means correction period.

3. A phase detection means according to claim 2 wherein said correction circuit includes a first correction flip-flop circuit connected to the output of said first edge detector flip-flop circuit for producing an output signal on a first output lead of said phase detector logic circuit and a second correction flip-flop circuit connected to and responsive to the output of said second edge detector flip-flop for producing an output signal condition on said first output lead of said phase detector logic circuit.

4. A phase detection means according to claim 3 wherein said synchronizing means includes first and second synchronizing flip-flop circuits, said first synchronizing flip-flop connected to the outputs of said first correction flip-flop circuit, said second correction flip-flop circuit and said XLO signal for producing an output signal at the end of said correction period, and said second synchronizing flip-flop circuit connected to the output of said first synchronizing flip-flop and said XLO signal to generate a synch-reset signal on the output lead from said second synchronizing flip-flop circuit, said output lead from said second synchronizing flip-flop circuit being connected to said first and second edge detector flip-flop circuits for resetting said first and second edge detector flip-flop circuits, said output signal from said second synchronizing flip-flop circuit being also connected to said first output lead from said phase detector logic circuit.

5. A phase detection means according to claim 4 further including logic gate circuit means connected to the output signals from said first and second correction flip-flop circuits and to said first output lead from said phase detection means for gating said correction pulse from said correction means to said first output lead.

6. A phase detection means according to claim 5 further including a first AND circuit connected to the outputs of said first and second correction flip-flop circuits for providing an input signal to said first synchronizing flip-flop circuit after the occurrence of both said FRD and FVD signals for generating said sync-reset signal.

7. A phase detection means according to claim 6 further including a second AND circuit connected to the output of said second synchronizing flip-flop circuit and to the output of said first edge detector flip-flop circuit for providing a reset signal to the input of said first edge detector flip-flop circuit and a third AND circuit connected to the output of said second synchronizing flip-flop circuit and to the output of said second edge detector flip-flop circuit for providing a reset signal to the input of said second edge detector flip-flop circuit.

* * * * *